United States Patent
Zhang et al.

(10) Patent No.: US 11,815,707 B2
(45) Date of Patent: Nov. 14, 2023

(54) DISPLAY DEVICE AND METHOD FOR MANUFACTURING SAME

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Bing Zhang, Beijing (CN); Puyu Qi, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 1029 days.

(21) Appl. No.: 16/456,667

(22) Filed: Jun. 28, 2019

(65) Prior Publication Data

US 2020/0119313 A1 Apr. 16, 2020

(30) Foreign Application Priority Data

Oct. 11, 2018 (CN) .......................... 201811185139.2

(51) Int. Cl.
*G02B 5/30* (2006.01)
*G06F 3/041* (2006.01)
(Continued)

(52) U.S. Cl.
CPC ......... *G02B 5/3025* (2013.01); *G02B 5/3083* (2013.01); *G06F 3/0412* (2013.01);
(Continued)

(58) Field of Classification Search
CPC ............. H01L 27/3232; H01L 27/3225; H01L 51/5284; H01L 51/5275; H01L 51/5281;
(Continued)

(56) References Cited

U.S. PATENT DOCUMENTS

| 5,345,324 | A | * | 9/1994 | Koseki | ............. | G02F 1/133512 |
| | | | | | | 349/44 |
| 2005/0042797 | A1 | * | 2/2005 | Lin | ................... | G02F 1/133516 |
| | | | | | | 438/70 |

(Continued)

FOREIGN PATENT DOCUMENTS

| CN | 103700326 A | * | 4/2014 |
| CN | 103700326 A | | 4/2014 |

(Continued)

OTHER PUBLICATIONS

First Office Action dated Mar. 24, 2020 for corresponding Chinese application 201811185139.2.

*Primary Examiner* — Sophie Hon
(74) *Attorney, Agent, or Firm* — Nath, Goldberg & Meyer; Joshua B. Goldberg

(57) ABSTRACT

The present disclosure provides a display device and a method for manufacturing the same. The display device includes: a display panel; and polarizing structures and light absorbing structures located on a light emitting side of the display panel. A plurality of groove structures are formed between the polarizing structures, and each of the light absorbing structures is located in the groove structures.

18 Claims, 5 Drawing Sheets

(51) Int. Cl.
*H10K 50/80* (2023.01)
*H10K 50/86* (2023.01)
*H10K 50/858* (2023.01)
*H10K 59/00* (2023.01)
*H10K 71/00* (2023.01)
*G06V 20/59* (2022.01)

(52) U.S. Cl.
CPC ........... *G06V 20/59* (2022.01); *H10K 50/858* (2023.02); *H10K 50/86* (2023.02); *H10K 50/865* (2023.02); *H10K 50/868* (2023.02); *H10K 59/00* (2023.02); *H10K 71/00* (2023.02); *C09K 2323/031* (2020.08)

(58) Field of Classification Search
CPC . H01L 51/5293; G06F 3/0412; G02B 5/3083; G02B 5/3025; C09K 2323/031; G02F 1/133548; G02F 1/133638; H10K 50/858; H10K 50/865; H10K 50/868; H10K 50/86; G06V 20/59
See application file for complete search history.

(56) References Cited

U.S. PATENT DOCUMENTS

| | | | |
|---|---|---|---|
| 2008/0309854 A1* | 12/2008 | Ge | G02F 1/13363 349/98 |
| 2010/0214506 A1* | 8/2010 | Gaides | G02B 5/3066 359/888 |
| 2012/0287506 A1* | 11/2012 | Yao | G03F 7/0007 359/491.01 |
| 2014/0203248 A1* | 7/2014 | Zhou | H10K 50/856 257/40 |
| 2015/0108483 A1* | 4/2015 | Lee | G02F 1/136213 257/71 |
| 2017/0285400 A1* | 10/2017 | Park | G02F 1/133536 |

FOREIGN PATENT DOCUMENTS

| | | | | |
|---|---|---|---|---|
| CN | 108508521 A | | 9/2018 | |
| CN | 109273508 B | * | 3/2021 | ........... G02B 5/3025 |
| EP | 2940496 A1 | * | 11/2015 | ............. B01J 19/12 |
| JP | 2006330616 A | | 12/2006 | |

* cited by examiner

DISPLAY DEVICE AND METHOD FOR MANUFACTURING SAME

CROSS-REFERENCE TO RELATED APPLICATION

This application claims priority from Chinese patent application No. 201811185139.2 filed with the China National Intellectual Property Administration on Oct. 11, 2018, the disclosure of which is incorporated herein by reference in its entirety.

TECHNICAL FIELD

The present disclosure relates to a technical field of display technology, and particularly relates to a display device and a method for manufacturing the same.

BACKGROUND

One of the characteristics of an organic light emitting display is a wider viewing angle. However, although this characteristic has advantages in some fields such as mobile phones, there are certain problems when an organic light emitting display is used as an in-vehicle display.

Due to a position of the in-vehicle display, a reflective reflection will be formed on a front windshield when the in-vehicle display is used for display. This phenomenon is particularly noticeable at night, which will interfere with a driver's observation of a road surface outside the vehicle, thereby affecting driving safety.

SUMMARY

The present disclosure has been accomplished in order to at least partially solve the problems in related art. The present disclosure provides a display device and a method for manufacturing the same that can avoid interference with a driver on a driving seat and thus improve driving safety.

According to an aspect of the disclosure, there is provided a display device, including:
  a display panel; and
  polarizing structures and light absorbing structures located on a light emitting side of the display panel,
    wherein a plurality of groove structures are formed between the polarizing structures, and each of the light absorbing structures is located in the groove structures.

In some embodiments, the polarizing structures are disposed in parallel with each other, and the light absorbing structures are disposed in parallel with each other.

In some embodiments, each of the polarizing structures has a trapezoidal cross section having a narrower flat bottom on a side adjacent to the display panel and a wider flat top on a side away from the display panel.

In some embodiments, a material of the polarizing structures includes a mixture of a dichroic dye and a polymerizable liquid crystal.

In some embodiments, a material of the light absorbing structures includes a black color resist.

In some embodiments, a pitch between two adjacent light absorbing structures ranges from 30 μm to 60 μm.

In some embodiments, a height of each of the light absorbing structures ranges from 20 μm to 50 μm.

In some embodiments, a ratio of height to width of each of the light absorbing structures is greater than or equal to 1.

In some embodiments, an angle between an extending direction of each of the light absorbing structures and a horizontal direction ranges from 7° to 13° or from −13° to −7°.

In some embodiments, an angle between an extending direction of each of the light absorbing structures and a horizontal direction ranges from 97° to 103° or from 77° to 83°.

In some embodiments, the display device further includes a light compensating layer located on a side of the polarizing structures and the light absorbing structures adjacent to the display panel.

In some embodiments, the display device further includes a first substrate layer, the first substrate layer being a polyimide alignment layer, and located between the light compensating layer and a layer in which the polarizing structures are located.

In some embodiments, the display device further includes a touch sensing layer located on a side of the polarizing structures and the light absorbing structures away from the light compensating layer.

In some embodiments, the display device further includes a protective film layer located on a side of the touch sensing layer away from the display panel.

In some embodiments, the light compensating layer includes a ¼ wave plate layer located on the display panel, and a ½ wave plate layer located on the ¼ wave plate layer.

In some embodiments, the ¼ wave plate layer includes a second substrate layer and a first polymerizable liquid crystal layer on the second substrate layer.

In some embodiments, the ½ wave plate layer includes a third substrate layer and a second polymerizable liquid crystal layer on the third substrate layer.

According to another aspect of the present disclosure, there is provided a method for manufacturing a display device, including:
  preparing a display panel;
  forming a light compensating layer on the display panel; and
  forming a first substrate layer, polarizing structures and light absorbing structures on the light compensating layer, wherein a plurality of groove structures are formed between the polarizing structures, and each of the light absorbing structures is located in the groove structures.

In some embodiments, the step of forming the light compensating layer on the display panel includes:
  forming a ¼ wave plate layer on the display panel; and
  forming a ½ wave plate layer on the ¼ wave plate layer.

In some embodiments, the step of forming the first substrate layer, the polarizing structures and the light absorbing structures on the light compensating layer includes:
  forming a first substrate layer on the light compensating layer;
  coating a polarizing material layer on the first substrate layer;
  roller imprinting and curing the polarizing material layer to form each of the polarizing structures; and
  pouring a light absorbing material into each of the groove structures between the polarizing structures, and curing the light absorbing material to form each of the light absorbing structures.

BRIEF DESCRIPTION OF DRAWINGS

FIG. 2b is a schematic structural view of a ¼ wave plate layer in FIG. 2a;

FIG. 2c is a schematic structural view of a ½ wave plate layer in FIG. 2a;

DETAILED DESCRIPTION

To improve understanding of the technical solution of the present disclosure for those skilled in the art, the display device and the method for manufacturing the same according to the present disclosure will be described below in detail in conjunction with the accompanying drawings.

Figure 1:
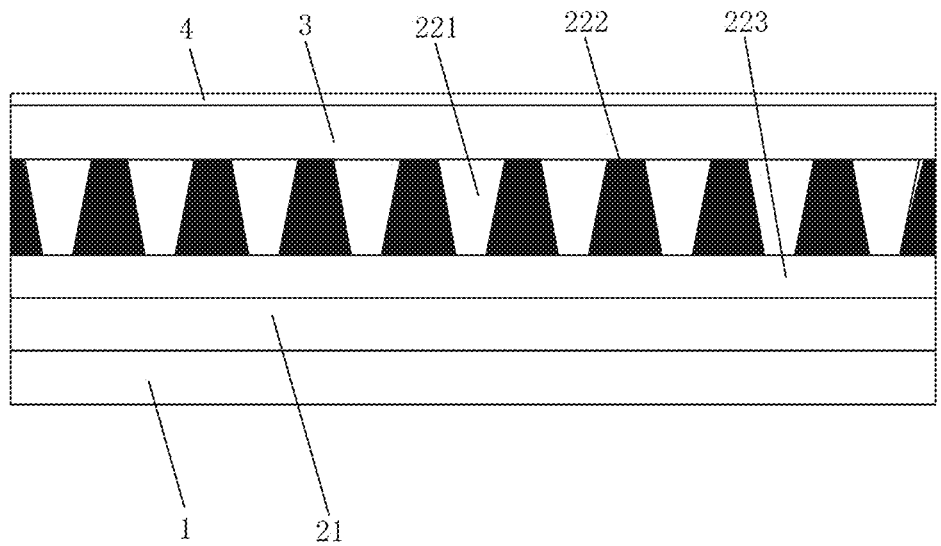
FIG. 1 is a schematic structural view showing a display device according to an exemplary embodiment of the present disclosure.

According to an aspect of the present disclosure, there is provided a display device. FIG. 1 is a schematic structural view showing a display device according to an exemplary embodiment of the present disclosure. As shown in FIG. 1, the display device includes a display panel 1, and polarizing structures 221 and light absorbing structures 222 located on a light emitting side of the display panel 1. A plurality of groove structures are formed between the polarizing structures 221, and each of the light absorbing structures 222 is located in the groove structures.

Figure 8A:
FIG. 8a is a schematic view showing a step of forming a first substrate layer.
Figure 8B:
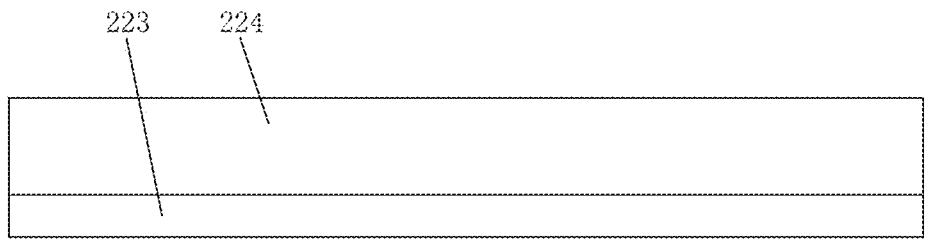
FIG. 8b is a schematic view showing a step of forming a polarizing material layer.
Figure 8C:
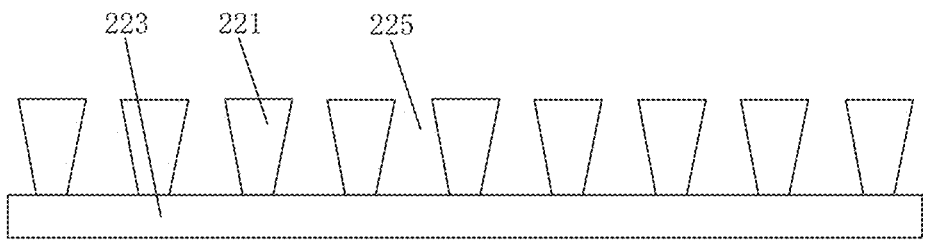
FIG. 8c is a schematic view showing a step of forming each of the polarizing structures.

In an exemplary embodiment of the present disclosure, a specific configuration of the groove structures can be seen in FIG. 8c, in which each of the light absorbing structures 222 is filled in the groove structures.

As shown in FIG. 1, the display device further includes a light compensating layer 21 located on a side of the polarizing structures 221 and the light absorbing structures 222 adjacent to the display panel 1. Specifically, the light compensating layer 21 is located on the display panel 1, and the polarizing structures 221 and the light absorbing structures 222 are located above the light compensating layer 21.

In an exemplary embodiment of the present disclosure, as shown in FIG. 1, the display device further includes a touch sensing layer 3, that is, a layer where a touch sensor is located. The touch sensing layer 3 is located on a side of the polarizing structures 221 and the light absorbing structures 222 away from the light compensating layer 21. Specifically, the touch sensing layer 3 is located above the polarizing structures 221 and the light absorbing structures 222.

In an exemplary embodiment of the present disclosure, as shown in FIG. 1, the display device further includes a protective film layer 4 located on a side of the touch sensing layer 3 away from the display panel 1. Specifically, the protective film layer 4 is located above the touch sensing layer 3.

In an exemplary embodiment of the present disclosure, the display panel 1 is an OLED display panel, and thus the display device is an OLED display device. In an exemplary embodiment of the present disclosure, the display device may be applied into a vehicle, and thus the display device may be an in-vehicle display device.

Figure 2A:
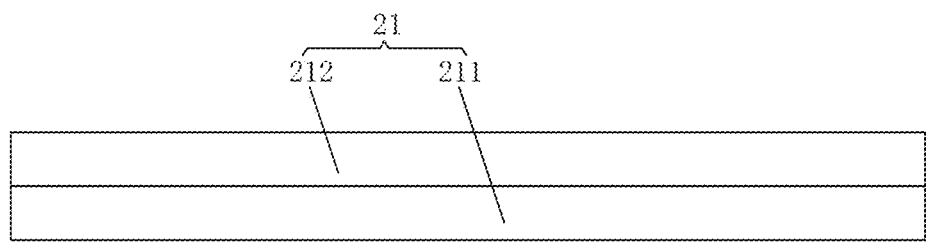
FIG. 2a is a schematic structural view of a light compensating layer in FIG. 1.
Figure 2B:
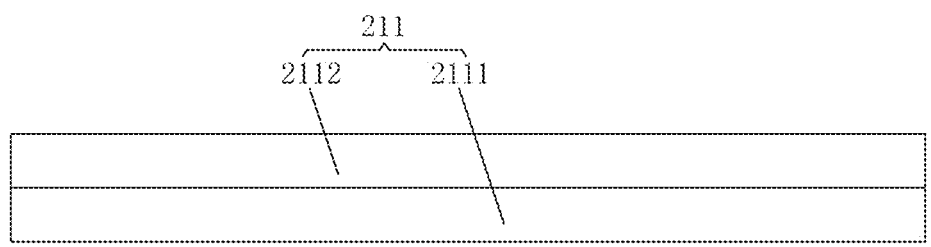
Figure 2C:
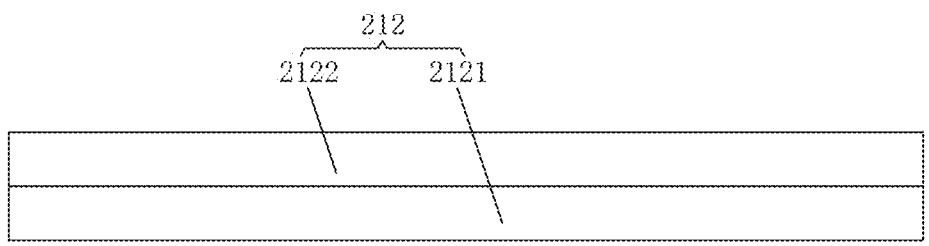

FIG. 2a is a schematic structural view of a light compensating layer in FIG. 1, FIG. 2b is a schematic structural view of a ¼ wave plate layer in FIG. 2a, and FIG. 2c is a schematic structural view of a ½ wave plate layer in FIG. 2a. As shown in FIGS. 1 and 2a, the light compensating layer 21 includes a ¼ wave plate layer 211 and a ½ wave plate layer 212. The ½ wave plate layer 212 is located on a side of the ¼ wave plate layer 211 away from the display panel 1. Specifically, the ¼ wave plate layer 211 is located above the display panel 1, and the ½ wave plate layer 212 is located above the ¼ wave plate layer 211. The ¼ wave plate layer 211 and the ½ wave plate layer 212 are used for optical compensation. In an exemplary embodiment of the present disclosure, as shown in FIG. 2b, the ¼ wave plate layer 211 includes a second substrate layer 2111 and a first polymerizable liquid crystal layer 2112 above the second substrate layer 2111. A material of the first polymerizable liquid crystal layer 2112 includes a polymerizable liquid crystal having a ¼ phase retardation to light. A material of the second substrate layer 2111 includes polyimide, and the second substrate layer 2111 is a polyimide alignment layer. In addition, as shown in FIG. 2c, the ½ wave plate layer 212 includes a third substrate layer 2121 and a second polymerizable liquid crystal layer 2122 on the third substrate layer 2121. A material of the second polymerizable liquid crystal layer 2122 includes a polymerizable liquid crystal having a ½ phase retardation to light. A material of the third substrate layer 2121 includes polyimide, and the third substrate layer 2121 is a polyimide alignment layer.

In an exemplary embodiment of the present disclosure, as shown in FIG. 1, the display device further includes a first substrate layer 223 on a side of the polarizing structures 221 and the light absorbing structures 222 adjacent to the display panel 1. Specifically, the first substrate layer 223 is located above the light compensating layer 21, while the polarizing structures 221 and the light absorbing structures 222 are both located above the first substrate layer 223.

In an exemplary embodiment of the present disclosure, as shown in FIG. 1, each of the polarizing structures 221 has a trapezoidal cross section having a narrower flat bottom on a side adjacent to the display panel 1 and a wider flat top on a side away from the display panel 1. Likewise, each of the light absorbing structures 222, having a complementary relationship with each of the polarizing structures 221 in shape, has a trapezoidal cross section having a wider flat bottom on a side adjacent to the display panel 1 and a narrower flat top on a side away from the display panel 1. Thus, the narrower flat bottom of each of the polarizing structures 221 and the wider flat bottom of each of the light absorbing structures 222 form a plane in contact with the first substrate layer 223, and the wider flat top of each of the polarizing structures 221 and the narrower flat top of each of the light absorbing structures 222 form a plane in contact with the touch sensing layer 3. With this configuration, a plurality of polarizing structures 221 and a plurality of light absorbing structures 222 are closely joined to form a layer having a flat surface on both sides. It is to be noted that setting end faces of the polarizing structures 221 and the light absorbing structures 222 to a plane can enable the polarizing structures 221 and the light absorbing structures 222 to be manufactured more easily, and enable a light output angle to be designed more easily. However, it should be understood that the top of each of the light absorbing structures 222 may also be disposed to be embedded in the respective polarizing structures 221, that is, the top of the light absorbing structure 222 is not exposed from the polarizing structure 221, and thus is not in contact with the touch sensing layer 3.

In an exemplary embodiment of the present disclosure, each of the polarizing structures 221 is transparent and has a linear polarizing effect, while each of the light absorbing structures 222 is opaque and has a light absorbing effect so that the display device can realize a display effect of a narrower viewing angle. The light absorbing structures 222 are arranged in a louvered structure.

In an exemplary embodiment of the present disclosure, as described above, a longitudinal section of each of the polarizing structures 221 is in a shape of an inverted trapezoidal structure, while a longitudinal section of the light absorbing structures 222 is in a shape of a regular trapezoidal structure. A longitudinal section is a plane perpendicular to a plane of the display panel 1 adjacent to the polarizing structures 221 and the light absorbing structures 222.

In an exemplary embodiment of the present disclosure, a material of the polarizing structures 221 includes a mixture of a dichroic dye and a polymerizable liquid crystal.

In an exemplary embodiment of the present disclosure, a material of the light absorbing structures 222 includes a black color resist.

In an exemplary embodiment of the present disclosure, a material of the first substrate layer 223 includes polyimide, and the first substrate layer 223 is a polyimide alignment layer.

Figure 3:
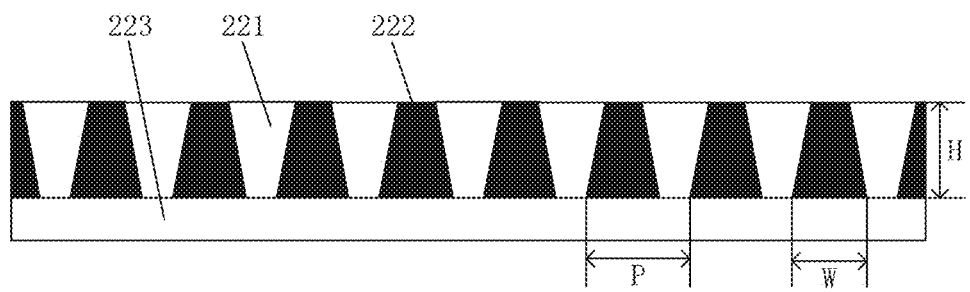
FIG. 3 is a schematic structural view of the polarizing structures and the light absorbing structures in FIG. 1.

FIG. 3 is a schematic structural view of the polarizing structures and the light absorbing structures in FIG. 1, where dimensions of the light absorbing structures are shown. As shown in FIG. 3, in an exemplary embodiment of the present disclosure, a pitch P between two adjacent light absorbing structures 222 ranges from 30 µm to 60 µm.

As shown in FIG. 3, in an exemplary embodiment of the present disclosure, a height H of each of the light absorbing structures 222 ranges from 20 µm to 50 µm.

As shown in FIG. 3, in an exemplary embodiment of the present disclosure, a ratio H/W of height to width of each of the light absorbing structures 222 is greater than or equal to 1. It is to be noted that the width W of each of the light absorbing structures 222 may be a minimum width, a maximum width, an average width, or a width of any portion of each of the light absorbing structures 222. As shown in FIG. 3, for example, when the longitudinal section of each of the light absorbing structures 222 is in the shape of a regular trapezoidal structure, the width W of each of the light absorbing structures 222 is a width of a bottom side of the regular trapezoidal structure, that is, the width W of each of the light absorbing structures 222 is the maximum width of each of the light absorbing structures 222.

In an exemplary embodiment of the present disclosure, the polarizing structures 221 and the light absorbing structures 222 are located in the same layer structure without additionally increasing a thickness of the display device. For example, each of the polarizing structures 221 and each of the light absorbing structures 222 may have a thickness of 30 µm.

Figure 4:
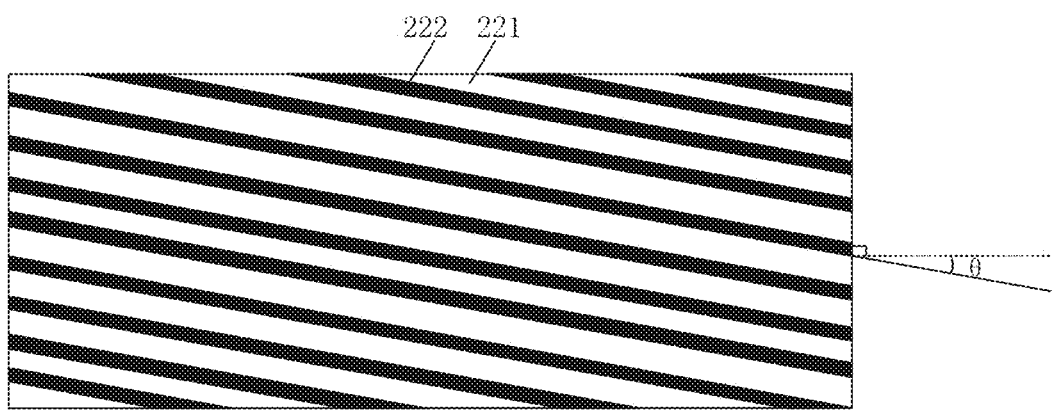
FIG. 4 is a schematic view of projections of the polarizing structures and the light absorbing structures of FIG. 3 on the display panel.

FIG. 4 is a schematic view of projections of the polarizing structures and the light absorbing structures of FIG. 3 on the display panel. As shown in FIGS. 1 and 4, a projection of each of the polarizing structures 221 on the display panel 1 has a strip shape, and a projection of each of the light absorbing structures 222 on the display substrate 1 also has a strip shape. The polarizing structures 221 are disposed in parallel with each other, and the light absorbing structures 222 are disposed in parallel with each other. An angle θ between an extending direction of each of the light absorbing structures 222 and a horizontal direction ranges from 7° to 13° or from −13° to −7°. The broken line in FIG. 4 indicates the horizontal direction.

Figure 5:
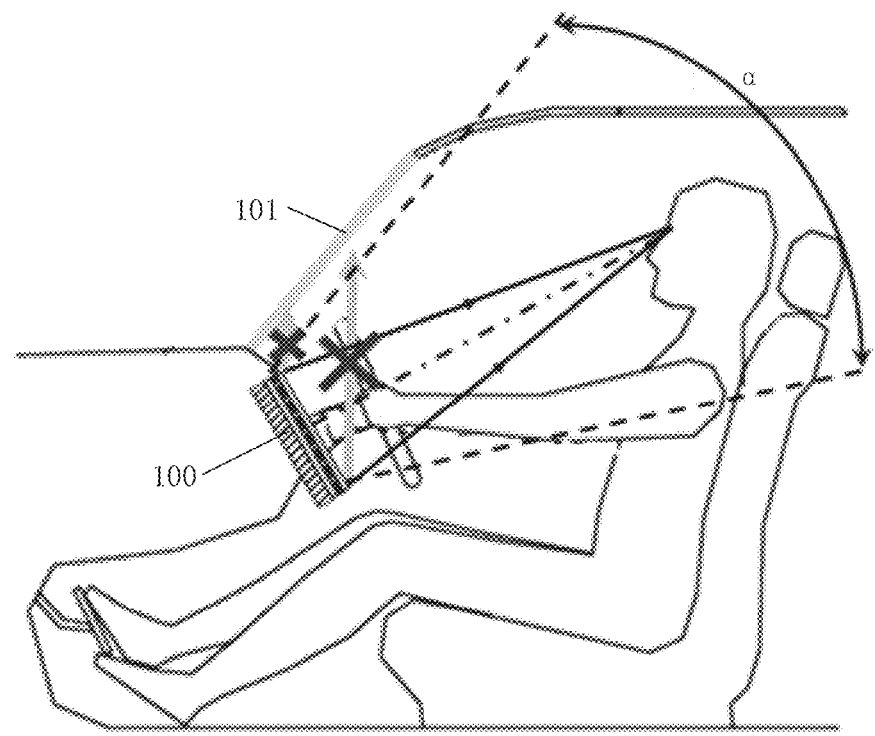
FIG. 5 is a schematic view of an application of the display device of FIG. 1.

FIG. 5 is a schematic view of an application of the display device of FIG. 1. As shown in FIG. 5, the display device 100 may be placed between a driving seat and a front passenger seat, where the display device 100 adopts the structure as shown in FIG. 3 so that the display device 100 may have an visual angle α as shown in FIG. 5, within which visual angle light emitted by the display device 100 does not illuminate a windshield 101. Therefore, a reflective reflection on the windshield 101 is avoided, thereby avoiding interference with a driver on the driving seat and thus improve driving safety at night. The angle θ between the extending direction of each of the light absorbing structures 222 and the horizontal direction may be set so that it is further ensured that the light emitted by the display device does not illuminate the windshield 101. For example, the angle θ between the extending direction of each of the light absorbing structures 222 and the horizontal direction may range from 7° to 13° or from −13° to −7° so that it is further ensured that the light emitted by the display device 100 does not illuminate the windshield 101.

In the technical solution of the display device provided by the exemplary embodiment, a plurality of groove structures are formed between the polarizing structures, and each of the light absorbing structures is located in the groove structures. Meanwhile, each of the polarizing structures has a linear polarizing effect and each of the light absorbing structures has a light absorbing effect so that the display device can realize a display effect of a narrower viewing angle, thereby preventing the display device from forming a reflective reflection on the windshield, thereby avoiding interference with the driver on the driving seat and thus improving driving safety.

According to another aspect of the present disclosure, there is provided another display device. The another display device differs from the display device as described above in that an angle θ between an extending direction of each of the light absorbing structures 222 and a horizontal direction ranges from 97° to 103° or from 77° to 83°.

Figure 6:
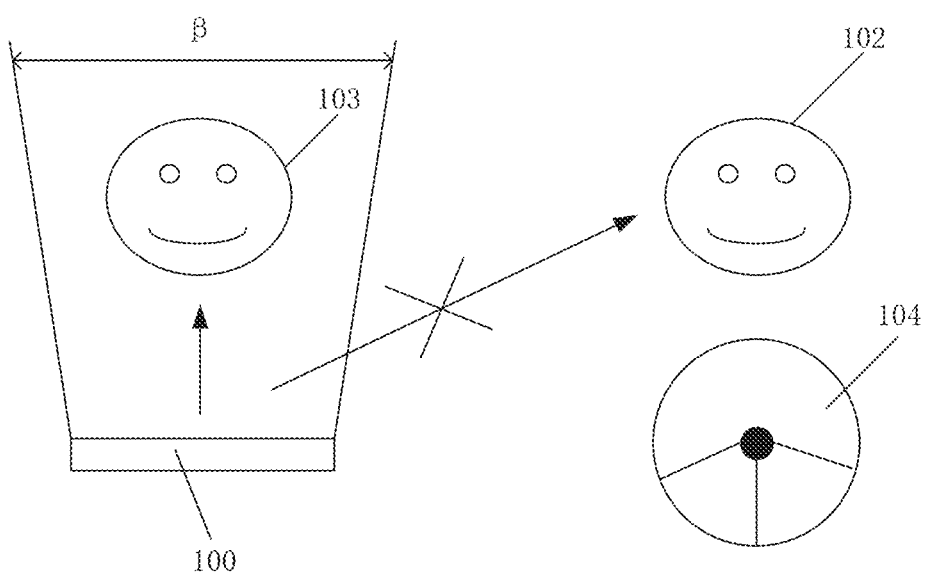
FIG. 6 is a schematic view of another application of the display device of FIG. 1.

FIG. 6 is a schematic view of another application of the display device of FIG. 1. As shown in FIG. 6, a steering wheel 104 is disposed in front of the driving seat, and the display device 100 may be placed in front of the front passenger seat. The display device 100 adopts the structure as shown in FIG. 3 so that the display device 100 may have an visual angle as shown in FIG. 6, within which visual angle the light emitted by the display device 100 does not illuminate a driver 102 on the driving seat. As a result, a content displayed on the display device 100 is visible to a passenger 103 on the front passenger seat, while being invisible to the driver 102 on the driving seat, thereby avoiding interference with the driver 102 on the driving seat and thus improving driving safety. The angle θ between the extending direction of each of the light absorbing structures 222 and the horizontal direction may be set so that it is further ensured that the light emitted by the display device 100 does not illuminate the driver 102 on the driving seat. For example, the angle θ between the extending direction of each of the light absorbing structures 222 and the horizontal direction may range from 97° to 103° or from 77° to 83° so that it is further ensured that the content displayed on the display device 100 is invisible to the driver 102 on the driving seat.

In the technical solution of the display device provided by the exemplary embodiment, a plurality of groove structures are formed between the polarizing structures, and each of the light absorbing structures is located in the groove structures. Meanwhile, each of the polarizing structures has a linear polarizing effect and each of the light absorbing structures has a light absorbing effect so that the display device can realize a display effect of a narrower viewing angle. As a result, in the display device, the displayed content is invisible to the driver on the driving seat, thereby avoiding interference with the driver on the driving seat and thus improving driving safety.

In the above description, the display device in which a plurality of groove structures are formed between the polarizing structures, and each of the light absorbing structures is located in the groove structures is described in detail. However, it should be understood that the present disclosure is not limited thereto. That is, the display device of the present disclosure is not limited to the configuration in which a plurality of groove structures are formed between the polarizing structures, and each of the light absorbing structures is located in the groove structures. For example, each of the light absorbing structures 222 having a trapezoidal section as shown in FIG. 1 may also be disposed in the ¼ wave plate layer 211 or ½ wave plate layer 212 of the light compensating layer 21, and an entire linear polarizing layer may consist of only polarizing structures 221. In this case, although the polarizing structures 221 and the light absorbing structures 222 are located in different layers, a display device formed by the two can still achieve the display effect of a narrower viewing angle.

According to still another aspect of the present disclosure, there is provided a method for manufacturing a display device, the method including:

preparing a display panel; forming a light compensating layer on the display panel and forming a first substrate layer, polarizing structures and light absorbing structures on the light compensating layer, wherein a plurality of groove structures are formed between the polarizing structures, and each of the light absorbing structures is located in the groove structures.

The method for manufacturing a display device provided by an exemplary embodiment of the present disclosure will be described in detail below by way of specific examples.

Figure 7:
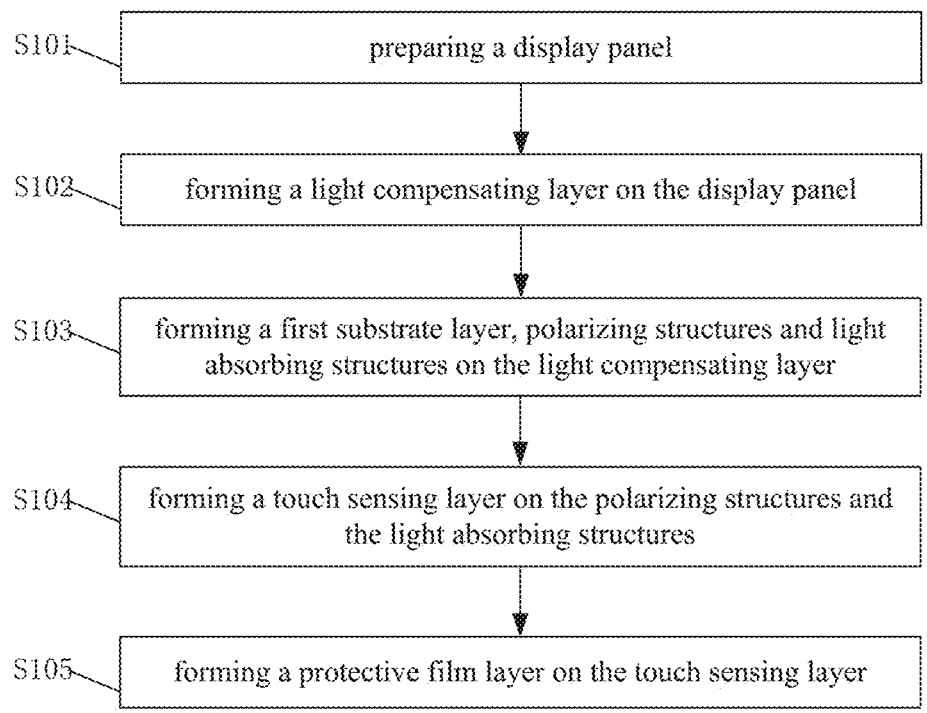
FIG. 7 is a flowchart illustrating a method for manufacturing a display device according to an exemplary embodiment of the present disclosure.

FIG. 7 is a flowchart illustrating a method for manufacturing a display device according to an exemplary embodiment of the present disclosure. As shown in FIG. 7, the method includes:

At step S101, a display panel 1 is prepared.

At step S102, a light compensating layer 21 is formed on the display panel 1.

As shown in FIGS. 1 and 2a to 2c, a light compensating layer 21 is formed on the display panel 1. The light compensating layer 21 includes a ¼ wave plate layer 211 and a ½ wave plate layer 212. The ¼ wave plate layer 211 includes a second substrate layer 2111 and a first polymerizable liquid crystal layer 2112 on the second substrate layer 2111. A material of the first polymerizable liquid crystal layer 2112 includes a polymerizable liquid crystal having a ¼ phase retardation to light. A material of the second substrate layer 2111 includes polyimide, and the second substrate layer 2111 is a polyimide alignment layer. The ½ wave plate layer 212 includes a third substrate layer 2121 and a second polymerizable liquid crystal layer 2122 on the third substrate layer 2121. A material of the second polymerizable liquid crystal layer 2122 includes a polymerizable liquid crystal having a ½ phase retardation to light. A material of the third substrate layer 2121 includes polyimide, and the third substrate layer 2121 is a polyimide alignment layer.

Specifically, the step S102 may include:

At step S1021, a ¼ wave plate layer 211 is formed on the display panel 1.

Specifically, a second substrate layer material is coated on the display panel 1 and cured by UV irradiation to form a second substrate layer 2111, wherein the second substrate layer material includes polyimide; and a first polymerizable liquid crystal material is coated on the second substrate layer 2111 and cured by UV irradiation to form a first polymerizable liquid crystal layer 2112, thereby forming the ¼ wave plate layer 211.

At step S1022, a ½ wave plate layer 211 is formed on the ¼ wave plate layer 212.

Specifically, a third substrate layer material is coated on the ¼ wave plate layer 211 and cured by UV irradiation to form a third substrate layer 2121, wherein the third substrate layer material includes polyimide; and a second polymerizable liquid crystal material is coated on the third substrate layer 2121 and cured by UV irradiation to form a second polymerizable liquid crystal layer 2122, thereby forming the ½ wave plate layer 212.

At step S103, a first substrate layer 223, polarizing structures 221 and light absorbing structures 222 are formed on the light compensating layer 21.

As shown in FIGS. 1 and 3, the display device further includes a first substrate layer 223, the polarizing structures 221 and the light absorbing structures 222 being located above the first substrate layer 223.

Specifically, step S103 may include:

At step S1031, a first substrate layer 223 is formed on the light compensating layer 21.

FIG. 8a is a schematic view showing a step of forming a first substrate layer. As shown in FIGS. 3 and 8a, a first substrate layer material is coated on the ½ wave plate layer 212 and cured by UV irradiation to form a first substrate layer 223.

At step S1032, a polarizing material layer 224 is coated on the first substrate layer 223.

FIG. 8b is a schematic view showing a step of forming a polarizing material layer. As shown in FIG. 8b, a polarizing material layer 224 is coated on the first substrate layer 223.

At step S1033, the polarizing material layer 224 is roller imprinted and cured to form each of the polarizing structures 221.

FIG. 8c is a schematic view showing a step of forming each of the polarizing structures 221. As shown in FIG. 8c, the polarizing material layer 224 is roller imprinted and cured to form each of the polarizing structures 221. A plurality of grooves 225 are formed between the polarizing structures 221, and a material of the polarizing material layer 224 includes a mixture of a dichroic dye and a polymerizable liquid crystal.

At step S1034, a light absorbing material is poured into each of the groove structures between the polarizing structures, and cured to form each of the light absorbing structures.

As shown in FIG. 3, a light absorbing material is poured into each of the groove structures 225 between the polarizing structures 221, and cured to form each of the light absorbing structures 222.

At step S104, a touch sensing layer 3 is formed on the polarizing structures 221 and the light absorbing structures 222.

At step S105, a protective film layer 4 is formed on the touch sensing layer 3.

The method for manufacturing a display device provided by the present exemplary embodiment may be used to manufacture the display device as described above.

In the technical solution of the method for manufacturing a display device provided by the exemplary embodiment, a plurality of groove structures are formed between the polarizing structures, and each of the light absorbing structures is located in the groove structures. Meanwhile, each of the polarizing structures has a linear polarizing effect and each of the light absorbing structures has a light absorbing effect so that the display device can realize a display effect of a narrower viewing angle, thereby preventing the display device from forming a reflective reflection on the windshield, and so that the displayed content is invisible to the driver on the driving seat, thus avoiding interference with the driver on the driving seat and improving driving safety.

It should be understood that the above embodiments are merely exemplary embodiments for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

What is claimed is:

1. A vehicle-mounted display device, comprising:
a display panel; and
polarizing structures and light absorbing structures located on a light emitting side of the display panel, wherein each of the polarizing structures has a linear polarizing effect and each of the light absorbing structures has a light absorbing effect,
wherein a plurality of groove structures, each of which is a through groove, are formed between the polarizing structures, and each of the light absorbing structures is located in the groove structures,
the vehicle-mounted display device further comprises a first substrate layer and a touch sensing layer, top and bottom surfaces of each of the polarizing structures are in direct contact with the first substrate layer and the touch sensing layer, respectively, and top and bottom surfaces of each of the light absorbing structures are in direct contact with the first substrate layer and the touch sensing layer, respectively, and
the vehicle-mounted display device is configured to be placed between a driving seat and a front passenger seat in the vehicle, an angle between an extending direction of each of the light absorbing structures and a horizontal direction ranges from 7° to 13° or from −13° to −7°, or, from 97° to 103° or from 77° to 83°, an extending direction of each of the polarizing structures is parallel to the extending direction of each of the light absorbing structures, and the horizontal direction is a direction parallel to a connecting line between the driving seat and the front passenger seat.

2. The vehicle-mounted display device according to claim 1, wherein the polarizing structures are disposed in parallel with each other, and the light absorbing structures are disposed in parallel with each other.

3. The vehicle-mounted display device according to claim 1, wherein each of the polarizing structures has a trapezoidal cross section having a narrower flat bottom on a side adjacent to the display panel and a wider flat top on a side away from the display panel.

4. The vehicle-mounted display device according to claim 1, wherein a material of the polarizing structures comprises a mixture of a dichroic dye and a polymerizable liquid crystal.

5. The vehicle-mounted display device according to claim 1, wherein a material of the light absorbing structures comprises a black color resist.

6. The vehicle-mounted display device according to claim 1, wherein a pitch between two adjacent light absorbing structures ranges from 30 μm to 60 μm.

7. The vehicle-mounted display device according to claim 1, wherein a height of each of the light absorbing structures ranges from 20 μm to 50 μm.

8. The vehicle-mounted display device according to claim 1, wherein a ratio of height to width of each of the light absorbing structures is greater than or equal to 1.

9. The vehicle-mounted display device according to claim 1, further comprising a light compensating layer located on a side of the polarizing structures and the light absorbing structures adjacent to the display panel.

10. The vehicle-mounted display device according to claim 9, wherein the first substrate layer is a polyimide alignment layer, and located between the light compensating layer and a layer in which the polarizing structures are located.

11. The vehicle-mounted display device according to claim 10, wherein the touch sensing layer is located on a side of the polarizing structures and the light absorbing structures away from the light compensating layer.

12. The vehicle-mounted display device according to claim 11, further comprising a protective film layer located on a side of the touch sensing layer away from the display panel.

13. The vehicle-mounted display device according to claim 9, wherein the light compensating layer comprises a ¼ wave plate layer located on the display panel, and a ½ wave plate layer located on the ¼ wave plate layer.

14. The vehicle-mounted display device according to claim 13, wherein the ¼ wave plate layer comprises a second substrate layer and a first polymerizable liquid crystal layer on the second substrate layer.

15. The vehicle-mounted display device according to claim 13, wherein the ½ wave plate layer comprises a third substrate layer and a second polymerizable liquid crystal layer on the third substrate layer.

16. A method for manufacturing a vehicle-mounted display device, wherein the vehicle-mounted display device is the vehicle-mounted display device according to claim 1, the method comprising:
preparing a display panel;
forming a light compensating layer on the display panel;
forming a first substrate layer, polarizing structures and light absorbing structures on the light compensating layer, wherein a plurality of groove structures are formed between the polarizing structures, and each of the light absorbing structures is located in the groove structures, and
resulting in the vehicle-mounted display device.

17. The method for manufacturing a vehicle-mounted display device according to claim 16, wherein the step of forming the light compensating layer on the display panel comprises:
forming a ¼ wave plate layer on the display panel; and
forming a ½ wave plate layer on the ¼ wave plate layer.

18. The method for manufacturing a vehicle-mounted display device according to claim 16, wherein the step of forming the first substrate layer, the polarizing structures and the light absorbing structures on the light compensating layer comprises:
  forming a first substrate layer on the light compensating layer;
  coating a polarizing material layer on the first substrate layer;
  roller imprinting and curing the polarizing material layer to form each of the polarizing structures; and
  pouring a light absorbing material into each of the groove structures between the polarizing structures, and curing the light absorbing material to form each of the light absorbing structures.

* * * * *